United States Patent [19]
Broseghini et al.

[11] Patent Number: 5,416,783
[45] Date of Patent: May 16, 1995

[54] METHOD AND APPARATUS FOR GENERATING PSEUDORANDOM NUMBERS OR FOR PERFORMING DATA COMPRESSION IN A DATA PROCESSOR

[75] Inventors: James L. Broseghini; James G. Viot, both of Austin, Tex.; Donald H. Lenhert, Manhattan, Kans.

[73] Assignee: Motorola, Inc., Schaumburg, Ill.

[21] Appl. No.: 103,614

[22] Filed: Aug. 9, 1993

[51] Int. Cl.⁶ .............................................. G06F 11/27
[52] U.S. Cl. ................................... 371/22.3; 364/579; 364/580; 364/717; 371/22.4; 371/22.5; 371/27
[58] Field of Search .................. 364/579, 580, 717; 371/22.3, 22.4, 27

[56] References Cited

U.S. PATENT DOCUMENTS

| | | | |
|---|---|---|---|
| 3,790,768 | 2/1974 | Chevalier et al. | 364/717 |
| 3,811,038 | 5/1974 | Reddaway | 364/717 |
| 3,838,259 | 9/1974 | Kortenhaus | 364/717 |
| 3,961,169 | 6/1976 | Bishop et al. | 364/717 |
| 4,047,008 | 9/1977 | Perkins | 364/717 |
| 4,142,239 | 2/1979 | Proto | 364/717 |
| 4,161,041 | 7/1979 | Butler et al. | 364/244 |
| 4,189,716 | 2/1980 | Krambeck | 340/347 |
| 4,493,046 | 1/1985 | Watanabe | 364/717 |
| 4,503,537 | 3/1985 | McAnney | 371/22.3 |
| 4,513,418 | 4/1985 | Bardell, Jr. et al. | 371/22.4 X |
| 4,607,176 | 8/1986 | Burrows et al. | 307/449 |
| 4,630,192 | 12/1986 | Wassell et al. | 364/715 X |
| 4,667,301 | 5/1987 | Chiu et al. | 364/717 |
| 4,718,065 | 1/1988 | Boyle et al. | 371/27 X |
| 4,771,429 | 9/1988 | Davis et al. | 371/27 |
| 4,780,840 | 10/1988 | Van Den Ende | 364/717 |
| 4,870,346 | 9/1989 | Mydill et al. | 371/27 X |
| 4,890,252 | 12/1989 | Wang | 364/717 |
| 4,897,838 | 1/1990 | Tateishi | 371/22.3 |
| 4,905,176 | 2/1990 | Schulz | 364/717 |
| 5,084,874 | 1/1992 | Whetsel, Jr. | 371/22.3 |
| 5,258,936 | 11/1993 | Gallup et al. | 364/717 |
| 5,301,199 | 4/1994 | Ikenaga et al. | 371/22.4 X |
| 5,325,367 | 6/1994 | Dekker et al. | 371/22.5 X |
| 5,329,471 | 7/1994 | Swoboda et al. | 364/578 |
| 5,341,096 | 8/1994 | Yamamura | 371/22.3 X |
| 5,369,648 | 11/1994 | Nelson | 371/27 |

OTHER PUBLICATIONS

Sybille Hellebrand, et al. "Generation of Vector Patterns Through Reseeding of Multiple-Polynomial Linear Feedback Shift Registers," International Test Conf. 1992, IEEE, pp. 120–129.

M. Morris Mano, "Computer System Architecture," 1976, Section 7: Central Processor Organization, pp. 232–243.

Frank F. Tsui; LSI/VLSI Testability Design; 1987; Chapter 7, pp. 169–212; Appendix C, pp. 55914 584.

Intel ®, "Intel486 ™ SL Microprocessor SuperSet System Design Guide," Nov. 1992, pp. 15-1 through 15-13.

Motorola, Inc., "CPU Central Processor Unit Reference Manual," 1989, Section 7: Development Support, pp. 7-1 through 7-35.

Primary Examiner—Edward R. Cosimano
Attorney, Agent, or Firm—Susan C. Hill

[57] ABSTRACT

A method and apparatus for generating pseudo-random numbers or for performing data compression in a data processor (12). In one form, the present invention generates pseudo-random numbers which are used to provide scan input data bits during built-in-self-test (BIST) scan testing. The present invention then performs data compression on the scan output data received back from the circuits under test (73–75). In one embodiment, the BIST scan testing of data processor (12) is performed in a special "background self-test mode". Central processing unit (CPU) 20 is used to generate the pseudo-random numbers and to perform the data compression. CPU 20 also functions as a standard CPU when in a normal operating mode.

21 Claims, 9 Drawing Sheets

METHOD AND APPARATUS FOR GENERATING PSEUDORANDOM NUMBERS OR FOR PERFORMING DATA COMPRESSION IN A DATA PROCESSOR

REFERENCE TO RELATED APPLICATIONS

The present application is related to the following U.S. patent applications:

Attorney Docket No. SC-01651A, titled "A Method and Apparatus for Generating Pseudo-random Numbers", invented by Michael G. Gallup et al., filed May 10, 1993, and having Ser. No. 08/058,836, which is a file wrapper continuation of Ser. No. 07/924,984, now U.S. Pat. No. 5,258,936 and Attorney Docket No. SC-00953A, titled "Method and Apparatus for Performing Restricted Modulo Arithmetic", invented by Michael Catherwood et al., filed Nov. 26, 1990, and having Ser. No. 07/617,725, now U.S. Pat. No. 5,249,148.

FIELD OF THE INVENTION

The present invention relates in general to data processors, and more particularly to a method and apparatus for generating pseudo-random numbers or for performing data compression in a data processor.

BACKGROUND OF THE INVENTION

As integrated circuits become more and more complex, it becomes more difficult to test the various circuits on an integrated circuit. Built-in-self-test (BIST) scan testing is a common testing methodology, well-known in the art, which can be used to test the various circuits on an integrated circuit. Unfortunately, however, BIST scan testing generally requires a significant amount of circuitry which must be added to the integrated circuit merely for purposes of testing.

For example, most BIST scan testing techniques require circuitry for generating a plurality of pseudo-random bits which are used as scan input bits to the circuits under test. Most BIST scan testing techniques also require circuitry for performing data compression on the long stream of scan output bits produced by the circuits under test. The output of the data compression step, the actual result, is then compared to the expected result. If the actual result is different than the expected result, the integrated circuit has failed the test. If the actual result is the same as the expected result, the integrated circuit has passed the test.

A linear-feedback shift-register (LFSR) is commonly used to generate pseudo-random numbers. An LFSR is a multi-stage shift-register with feedback connections via exclusive-OR (XOR) gates. Outputs of the last stage and some intermediate stages are tapped and fed back to the first stage via XOR-gates. The first and last stages being the leftmost and rightmost bit-positions, respectively, if the register shifts left-to-right. In existing LFSRs, the polynomial which is used to generate the pseudo-random numbers is determined by the hardwired feedback connections from the various stages of the LFSR. Note that a shift register which shifts right-to-left may alternately be used. Also, there are a variety of possible implementations of LFSRs, such as type 1 and type 2. The use of an LFSR for generating pseudo-random numbers is well-known in the art.

A multiple input signature register (MISR) is often used to perform data compression. Like the LFSR, the MISR is a multi-stage shift-register with feedback connections via exclusive-OR (XOR) gates. Outputs of the last stage and some intermediate stages are tapped and fed back to the first stage via XOR-gates. The first and last stages being the leftmost and rightmost bit-positions, respectively, if the register shifts left-to-right. In existing MISRs, the polynomial which is used for data compression is determined by the hardwired feedback connections from the various stages of the MISR. Note that a shift register which shifts right-to-left may alternately be used. Also, there are a variety of possible implementations of MISRs, such as type 1 and type 2. The use of a MISR for performing data compression is well-known in the art.

Many integrated circuits today incorporate some form of self-test capability. The MC68HC11 family of microcontrollers, (available from Motorola, Inc. of Austin, Tex.) uses a bootstrap mode which can be used in conjunction with a serial communication interface to perform a self-test. The MC68HC11 bootstrap mode uses self-test software which is loaded into the on-board random access memory (RAM) by means of the serial communication interface. The MC68HC11 family of microcontrollers does not use BIST scan testing. The Intel 80486 microprocessor (available from Intel, Corp. of Santa Clara, Calif.) has a built-in-self-test capability and a scan test capability which requires a significant amount of dedicated circuitry.

Self-test capability is quickly becoming a necessary feature of many integrated circuits. However some self-test techniques, such as BIST scan testing, require a significant amount of specialized test circuitry in order to sufficiently test an integrated circuit. The addition of this specialized test circuitry increases the integrated circuit die size, and thus increases the cost of the integrated circuit.

SUMMARY OF THE INVENTION

The previously mentioned needs are fulfilled and other advantages achieved with the present invention. In one form, the present invention is a method and apparatus for generating pseudo-random numbers or for performing data compression in a data processor. In one form, the present invention is a method and apparatus for performing scan testing.

In one embodiment, the present invention is a method for operating a data processor. The method includes the step of executing an instruction using an arithmetic logic unit while the data processor is in a normal operating mode. The method includes the step of placing the data processor in a special test mode. The method includes the step of generating a plurality of pseudo-random bits using the arithmetic logic unit. The method includes the step of performing a scan test to produce a scan test result. And, the method includes the step of performing data compression of the scan test result using the arithmetic logic unit.

The present invention will be understood by one skilled in the art from the detailed description below in conjunction with the accompanying drawings.

DESCRIPTION OF THE PREFERRED EMBODIMENT

By adding a small amount of circuitry, a central processing unit (CPU) on an integrated circuit can be used to perform a thorough scan test of various other circuitry located on the same integrated circuit. The existing circuitry in the CPU, including registers, an arithmetic logic unit (ALU), and various busses, can serve multiple purposes. During a normal operating mode, the circuitry in the CPU can be used to execute instructions in the same manner as prior art CPUs. However, in a special test mode, the circuitry in the CPU can be used to generate pseudo-random numbers and to perform data compression for a self-test capability which uses BIST scan testing.

The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

The term "bus" will be used to refer to a plurality of signals which may be used to transfer one or more various types of information, such as data, addresses, control, or status.

The symbol "$" preceding a number indicates that the number is represented in its hexadecimal or base sixteen form.

DESCRIPTION OF THE FIGURES

Figure 1:
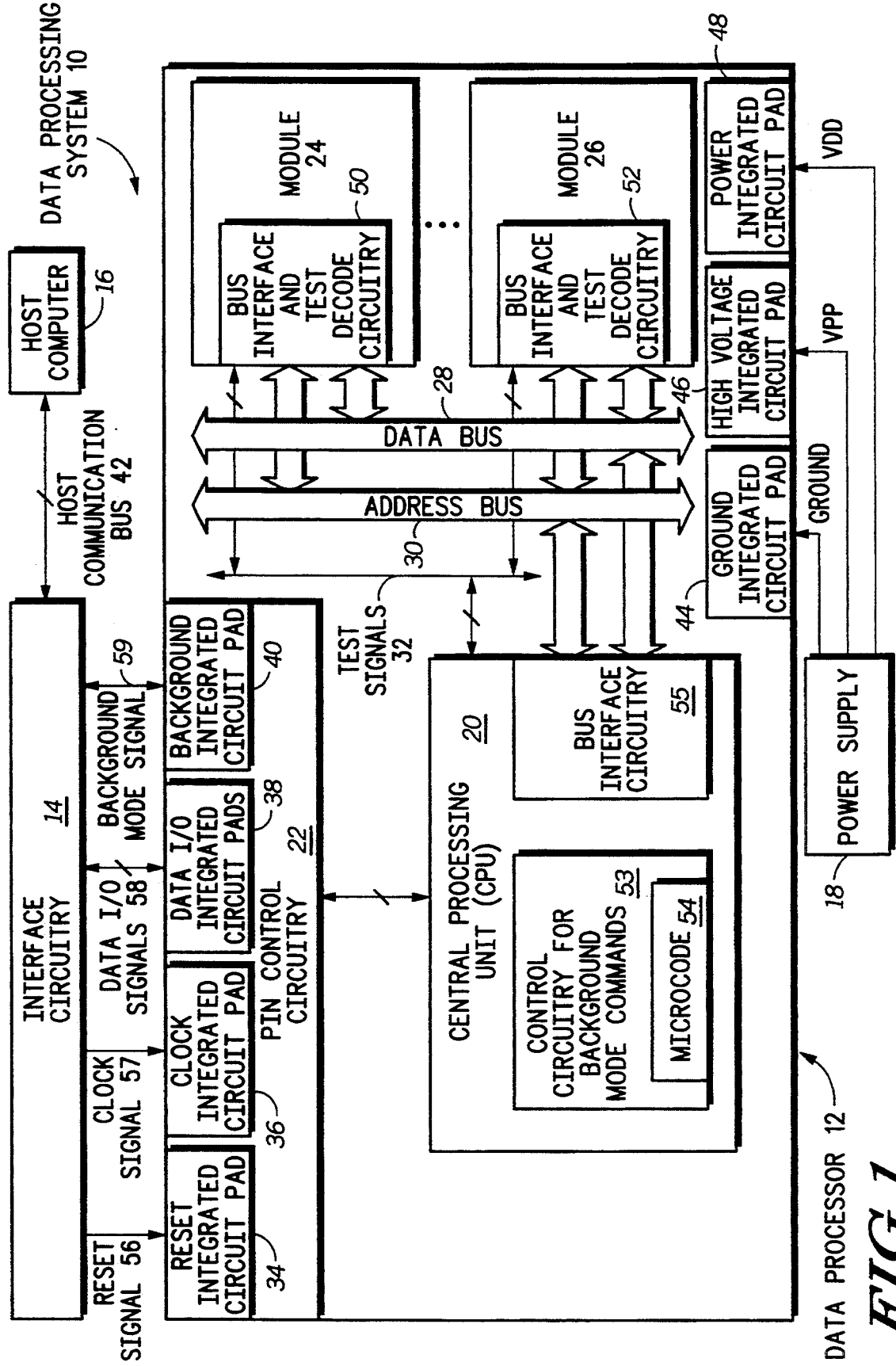
FIG. 1 illustrates, in block diagram form, a data processing system 10 in accordance with one embodiment of the present invention.

FIG. 1 illustrates a data processing system 10 in accordance with one embodiment of the present invention. Data processing system 10 has a data processor 12, interface circuitry 14, a host computer 16, and a power supply 18.

Data processor 12 has a central processing unit 20 which is bi-directionally coupled to pin control circuitry 22. Data processor 12 has a plurality of modules, such as module 24 and module 26, which may be bi-directionally coupled to CPU 20 by way of data bus 28, address bus 30, and test signals 32. In an alternate embodiment of the present invention, modules 24 and 26 may be uni-directionally coupled to address bus 30 in order to receive addresses. Module 24 has bus interface and test decode circuitry 50 which is coupled to data bus 28, address bus 30, and test signals 32. Module 26 has bus interface and test decode circuitry 52 which is coupled to data bus 28, address bus 30, and test signals 32.

Pin control circuitry 22 has a reset integrated circuit bonding pad 34, a clock integrated circuit bonding pad 36, data I/O integrated circuit bonding pads 38, and a background integrated circuit bonding pad 40. Data processor 12 receives a reset signal 56 from interface circuitry 14 by way of reset integrated circuit bonding pad 34. Data processor 12 receives a clock signal 57 from interface circuitry 14 by way of clock integrated circuit bonding pad 36. Data processor 12 receives data I/O signals 58 from interface circuitry 14 by way of data I/O integrated circuit bonding pads 38. And, data processor 12 receives a background mode signal from interface circuitry 14 by way of background integrated circuit bonding pad 40. Interface circuitry 14 is bi-directionally coupled to host computer 16 by way of host communication bus 42.

Data processor 12 has a ground integrated circuit bonding pad 44, a high voltage integrated circuit bonding pad 46, and a power integrated circuit bonding pad 48. Data processor 12 receives a ground voltage level from power supply 18 by way of ground integrated circuit bonding pad 44. Data processor 12 receives a high voltage level from power supply 18 by way of high voltage integrated circuit bonding pad 46. Data processor 12 receives a power voltage level from power supply 18 by way of power integrated circuit bonding pad 48.

Central processing unit 20 has control circuitry for background mode commands 53. Control circuitry for background mode commands 53 includes microcode circuitry 54 which is used to control portions of CPU 20 during the execution of background mode commands. CPU 20 also includes bus interface circuitry 55.

Figure 2:
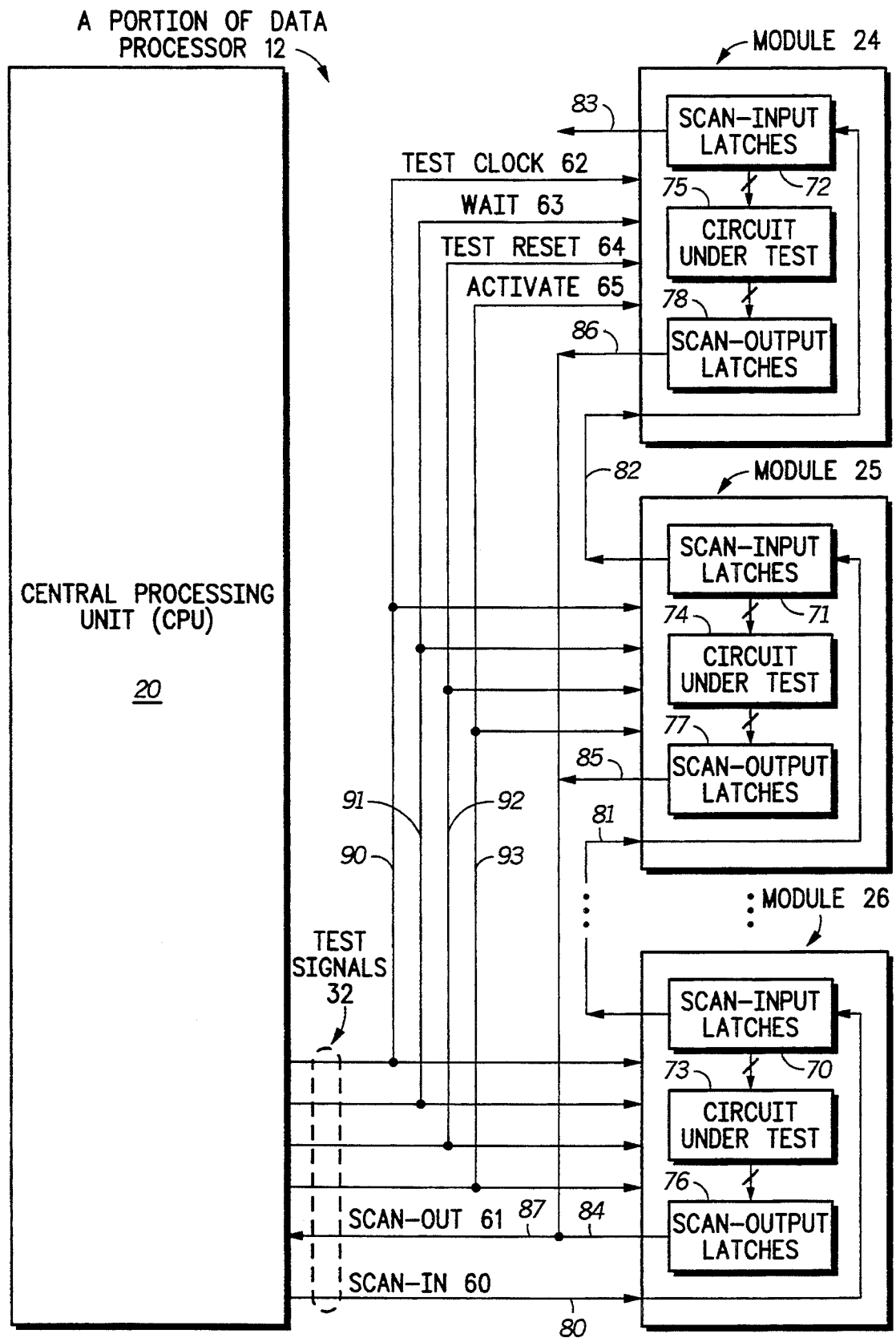
FIG. 2 illustrates, in block diagram form, a portion of data processor 12 in accordance with one embodiment of the present invention.

FIG. 2 illustrates a portion of the data processor 12 of FIG. 1 in accordance with one embodiment of the present invention. Module 24 has scan-input latches 72, circuit under test 75, and scan-output latches 78. Module 25 has scan-input latches 71, circuit under test 74, and scan-output latches 77. Module 26 has scan-input latches 70, circuit under test 73, and scan-output latches 76.

Test signals 32 include a scan-in signal 60, a scan-out signal 61, a test clock signal 62, a wait signal 63, a test reset signal 64, and an activate signal 65. Scan-in signal 60 may be transferred across conductors 80–82. Scan-out signal 61 may be transferred across conductors 84–87. Test clock signal 62 may be transferred across conductor 90. Wait signal 63 may be transferred across conductor 91. Test reset signal 64 may be transferred across conductor 92. And, activate signal 65 may be transferred across conductor 93.

Scan-input latches 70 are coupled to conductor 80, conductor 81, and circuit under test 73. Scan-output latches 76 are coupled to circuit under test 73 and to conductor 84. Scan-input latches 71 are coupled to conductor 81, conductor 82, and circuit under test 74. Scan-output latches 77 are coupled to circuit under test 74 and to conductor 85. Scan-input latches 72 are coupled to conductor 82 and to circuit under test 75. Scan-input latches 72 may be coupled to conductor 83. Scan-output latches 78 are coupled to circuit under test 75 and to conductor 86.

Figure 3:
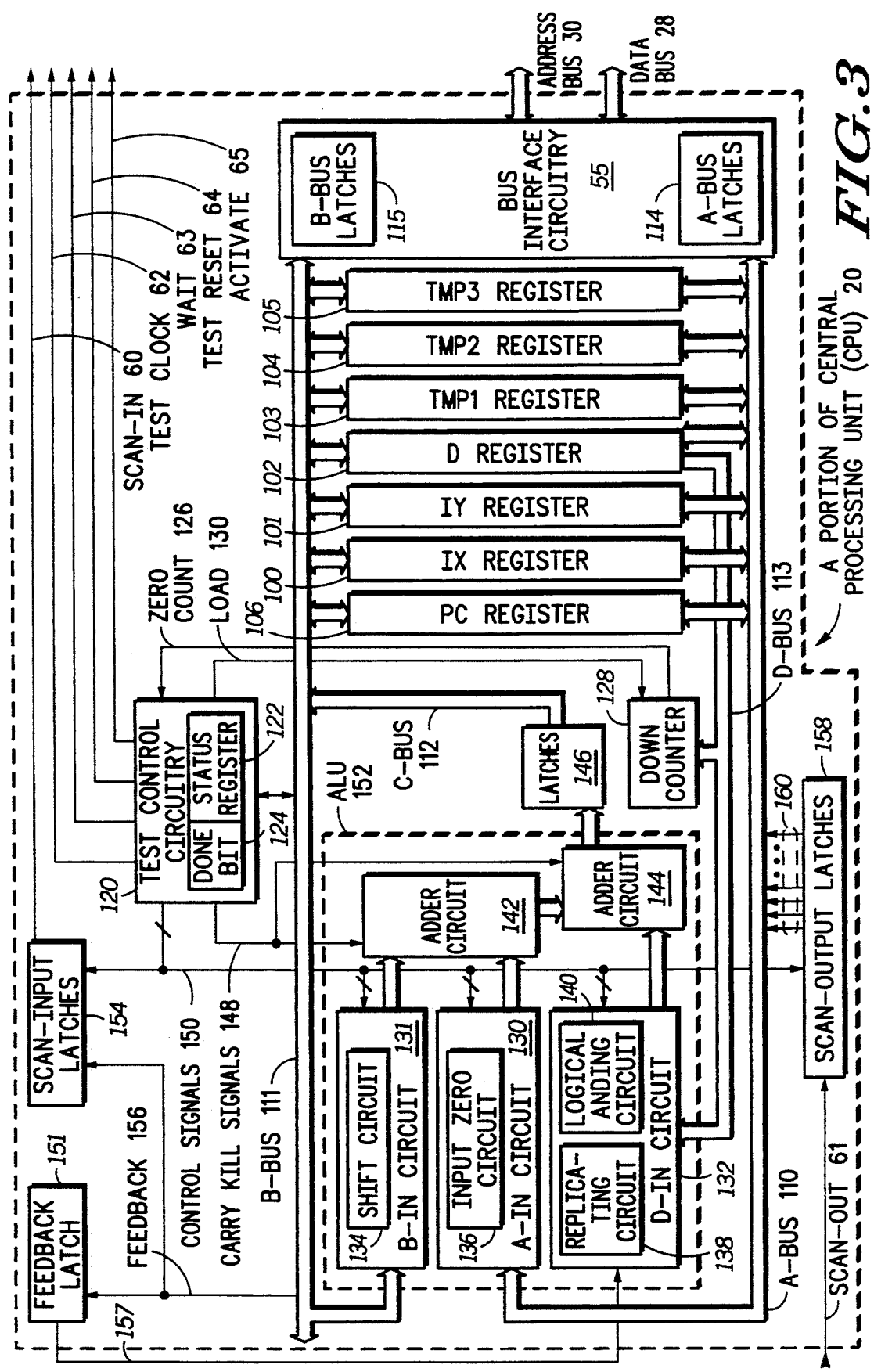
FIG. 3 illustrates, in block diagram form, a portion of central processing unit (CPU) 20 in accordance with one embodiment of the present invention.

FIG. 3 illustrates a portion of the central processing unit (CPU) 20 of FIG. 1 in accordance with one embodiment of the present invention. CPU 20 has a plurality of registers, including IX register 100, IY register 101, D register 102, TMP1 register 103, TMP2 register 104, TMP3 register 105, and program counter (PC) register 106. Each register 100–106 is bi-directionally coupled to A-bus 110 and to B-bus 111. A-bus latches 114 are coupled to A-bus 110. B-bus latches 115 are coupled to B-bus 115. Bus interface circuitry 55 includes A-bus latches 114 and B-bus latches 115. Bus interface circuitry 55 is coupled to data bus 28 and to address bus 30.

CPU 20 includes test control circuitry 120. Test control circuitry 120 includes a status register 122. Status register 122 has a DONE bit 124. Test control circuitry 120 generates test clock signal 62, wait signal 63, test reset signal 64, and activate signal 65. Test control circuitry 120 transfers a load signal 130 to down counter 128. Down counter 128 transfers a zero count signal 126 to test control circuitry 120. Down counter 128 is coupled to D-bus 113.

Test control circuitry 120 is coupled to A-in circuit 130, B-in circuit 131, and D-in circuit 132. Test control circuitry 120 generates control signals 150 which are provided to A-in circuit 130, B-in circuit 131, and D-in circuit 132. B-in circuit 131 has a shift circuit 134. A-in circuit 130 has an input zero circuit 136. D-in circuit 132 has a replicating circuit 138 and a logical ANDing circuit 140. A-in circuit 130 is coupled to A-bus 110 and to an a first input of adder circuit 142. B-in circuit 131 is coupled to B-bus 111 and to a second input of adder circuit 142. D-in circuit 132 is coupled to D-bus 113, to a first input of adder circuit 144, and to a feedback latch 151. D-bus 113 is also coupled to D register 102 and to down counter 128.

The output of adder circuit 142 is coupled to a second input of adder circuit 144. The output of adder circuit 144 is coupled to latches 146. Latches 146 are coupled to C-bus 112. Test control circuitry 120 is coupled to adder circuit 142 and to adder circuit 144. Test control circuitry 120 generates a carry kill signal 148 which is provided to adder circuits 142 and 144. Arithmetic logic unit circuit (ALU) 152 includes A-in circuit 130, B-in circuit 131, D-in circuit 132, adder circuit 142, and adder circuit 144.

CPU 20 includes scan-input latches 154. Scan-input latches 154 are coupled to test control circuitry 120 by way of control signals 150. Scan-input latches 154 and feedback latch 151 are coupled to B-bus 111 by way of conductor 156. Scan-input latches 154 provide a scan-in signal 60 which is transferred external to CPU 20. Feedback latch 151 is coupled to D-in circuit 132 by way of conductor 157. CPU 20 includes scan-output latches 158. Scan-output latches 158 are coupled to test control circuitry 120 by way of control signals 150. Scan-output latches 158 are coupled to A-bus 110 by way of conductors 160. Scan-output latches 158 receive a scan-out signal 61 which is provided from external to CPU 20.

FIGS. 4–8 illustrate, in flow diagram form, a method for performing BIST scan testing of data processor 12 in accordance with one embodiment of the present invention. FIG. 9 illustrates, in flow diagram form, a method for generating pseudo-random numbers in accordance with one embodiment of the present invention. And, FIG. 10 illustrates, in flow diagram form, a method for performing data compression in accordance with one embodiment of the present invention.

Figure 8:
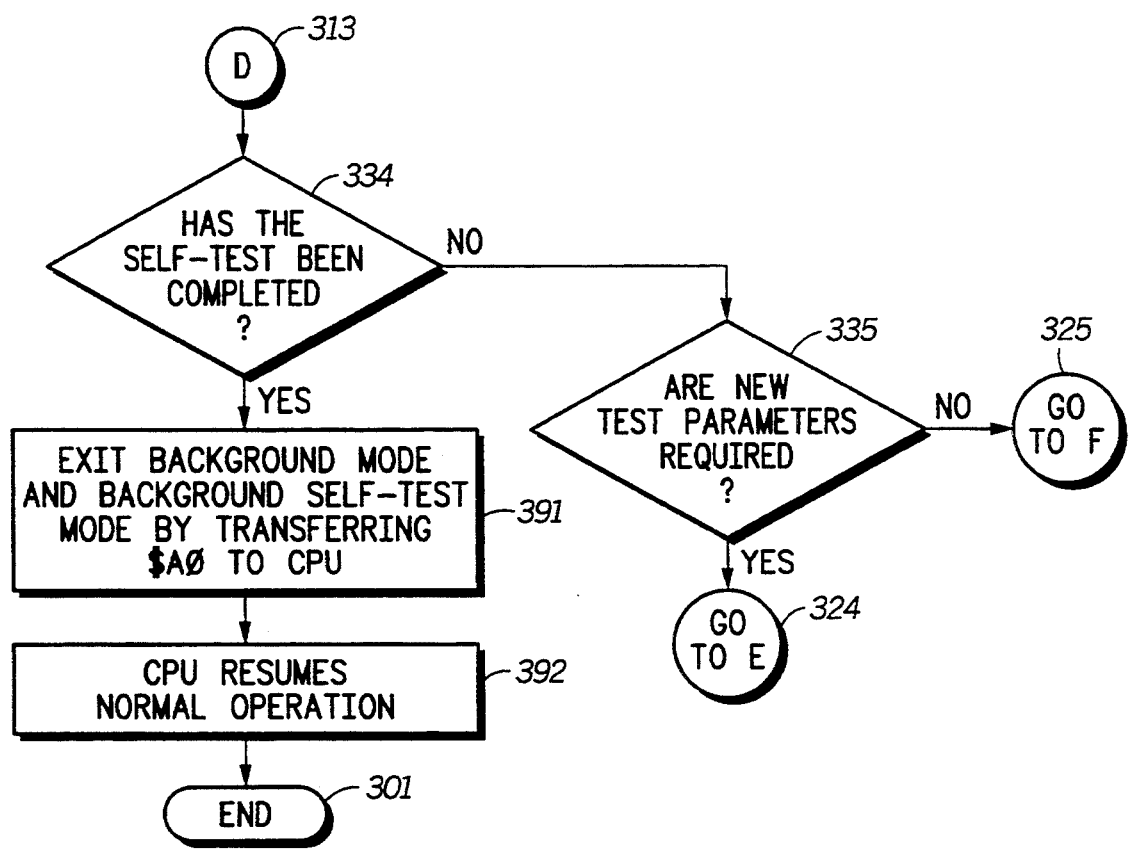
Figure 9:
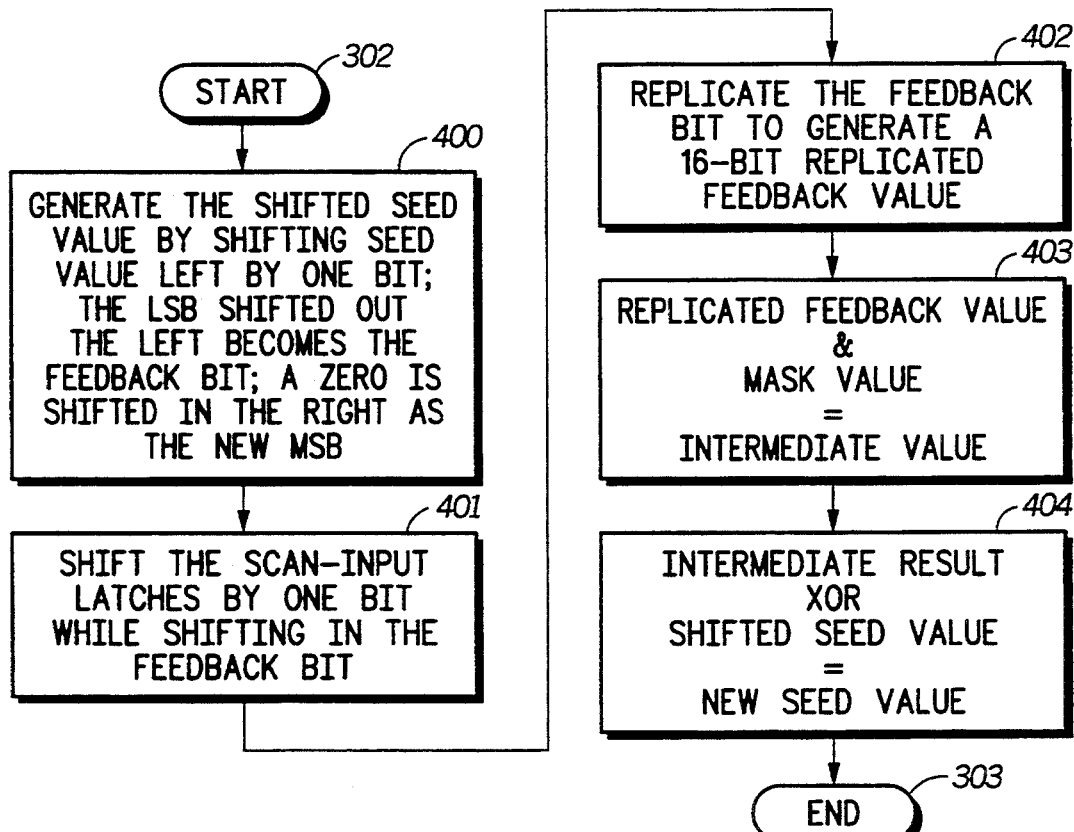
FIG. 9 illustrates, in flow diagram form, a method for generating pseudo-random numbers in accordance with one embodiment of the present invention.
Figure 10:
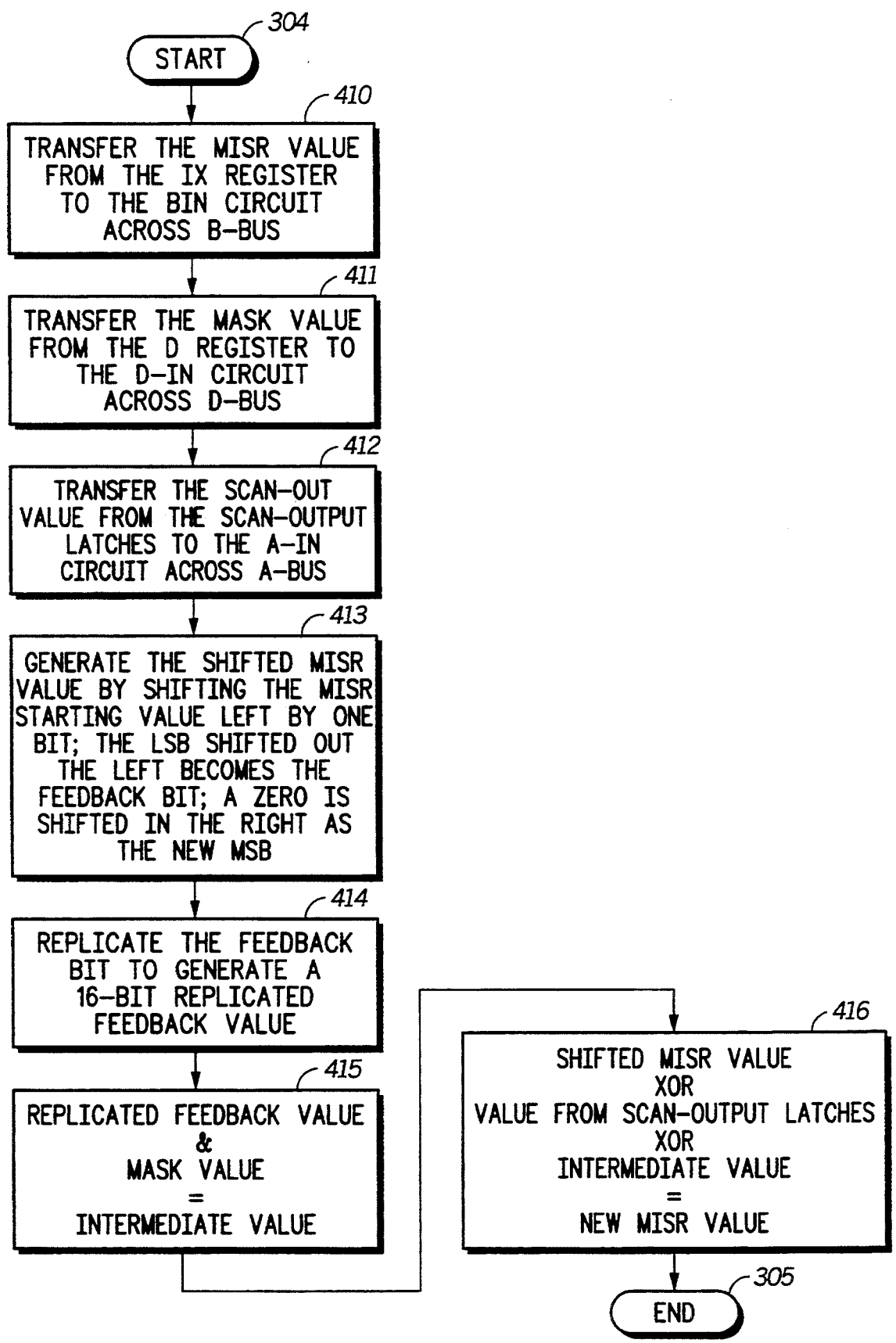
FIG. 10 illustrates, in flow diagram form, a method for performing data compression in accordance with one embodiment of the present invention.

Referring to FIGS. 4–10, flattened ovals 300–306 represent starting and ending points in the flow diagram. Circles 310–316 represent particular points in the flow diagram. Circles 320–326 represent transitions to particular points in the flow diagram. Diamonds 330–335 represent decision points in the flow diagram. Rectangles 371–392 represent steps which are performed in order to perform BIST scan testing. Referring to FIG. 9, rectangles 400–404 represent steps which are performed in order to generate pseudo-random numbers. Referring to FIG. 10, rectangles 410–416 represent steps which are performed in order to perform data compression.

OPERATION OF A PREFERRED EMBODIMENT

BIST scan testing is a common testing methodology, well-known in the art, which can be used to test the various circuits on an integrated circuit. The manner in which BIST scan testing is performed in an integrated circuit is well known in the art. Referring to FIG. 3, test control circuitry 120 is used to generate the signals which are used to control the BIST scan testing. In the illustrated embodiment of the present invention, the BIST scan testing control signals include test clock signal 62, wait signal 63, test reset signal 64, and activate signal 65. Alternate embodiments of the present invention may use more, fewer, or different control signals to control the BIST scan testing.

Still referring to FIG. 3, CPU 20 generates pseudo-random bits which are stored in scan-input latches 154. Once the scan-input latches 154 have been properly loaded with pseudo-random bits, test control circuitry 120 sends a control signal 150 to scan-input latches 154 to begin the scan-in shifting. Note that in an alternate embodiment of the present invention, scan-input latches 154 may not be used; instead, the pseudo-random bits may be transferred directly to modules 24–26 once they have been generated.

Referring to FIGS. 2 and 3, scan-input latches 154 in CPU 20 and scan-input latches 70–72 in modules 24–26 can effectively function as one large shift register. Scan-input latches 154 and 70–72 can be shifted simultaneously while the shift-out bit from scan-input latches 154 is shifted into scan-input latches 70, the shift-out bit from scan-input latches 70 is shifted into scan-input latches 71, and the shift-out bit from scan-input latches 71 is shifted into scan-input latches 72. The shift-out bit from scan-input latches 72 is discarded and is not used. In one embodiment of the present invention, each time that scan-input latches 154 and 70–72 are shifted simultaneously, a new pseudo-random bit may be generated by CPU 20 and loaded into scan-input latches 154 across conductor 156 as the shift-in bit. In alternate embodiments of the present invention, a fixed value, such as a zero value may be shifted in as the new bit.

CPU 20 uses the scan-in signal 60 to transfer serial data bits to scan-input latches 70 across conductor 80. Scan-input latches 70 use the scan-in signal 60 to transfer serial data bits to scan-input latches 71 across conductor 81. Scan-input latches 71 use the scan-in signal 60 to transfer serial data bits to scan-input latches 72 across conductor 82. In an alternate embodiment of the present invention, scan-input latches 72 could use the scan-in signal 60 to transfer serial data bits across conductor 83 to scan-input latches (not shown) in another module (not shown) in CPU 20.

In alternate embodiments of the present invention, data bus 28 may provide information to modules 24–26 regarding which scan-input latches 70–72 will be loaded. For example, if scan-input latches 70 are not selected, the pseudo-random bit shifted in across conductor 84 may merely be shifted out across conductor 81. Thus scan-input latches 70 may be deselected and not loaded. Thus only the scan-input latches 70–72 which are selected participate in the loading process and are loaded with pseudo-random bits. One, a portion, or all scan-input latches 70–72 may be selected at the same time; but only the scan-input latches 70–72 which are selected can receive pseudo-random bits across the scan-in signal 60.

Likewise, in some embodiments of the present invention, data bus 28 may provide information to modules 24–26 regarding which circuits under test 73–75 will be activated. For example, if circuit under test 73 is not selected, the activate signal 65 will have no effect on circuit under test 73. And if circuit under test 73 is selected, the activate signal 65 will effect circuit under test 73 and circuit under test 73 will produce outputs. Thus, circuit under test 73 may be selectively included or excluded as part of a particular test. One, a portion, or all circuits under test 73–75 may be selected at the same time; but only the circuits under test 73–75 which are selected use the pseudo-random bits as inputs to produce corresponding outputs.

In some embodiments of the present invention, data bus 28 may also provide information to modules 24–26 regarding which scan-output latches 76–78 will be selected. For example, if scan-output latches 76 are not selected, the bits stored in scan-output latches 76 will not be serially scanned out across conductor 84. And if scan-output latches 76 are selected, the bits stored in scan-output latches 76 will be serially scanned out across conductor 84. Thus scan-output latches 76–78 may be either selected or not selected.

One, a portion, or all scan-output latches within a module 24–26 may be selected at the same time. Note that in the embodiment of the present invention illustrated in FIG. 2, only the scan-output latches 76–78 within one module 24–26 can be selected at a time in order to prevent contention on scan-out signal 61. Alternately, the scan-out signal 61 could be implemented as a chain in the same manner as the scan-in signal 60 to avoid contention.

Once the selected scan-input latches 70–72 have been serially loaded with the pseudo-random bits, the test reset signal 64 is asserted in order to clear the scan-output latches 158 in CPU 20 and to clear the scan-output latches 76–78 in modules 24–26. In one embodiment of the present invention, the test reset signal 64 always clears all of the scan-output latches 158 and 76–78. In an alternate embodiment of the present invention, the test reset signal 64 only clears the scan-output latches 158 and 76–78 which are selected. The test reset signal 64 is then negated.

The test clock signal 62 is used to clock the circuitry in the circuit under test 73. The test clock signal 62 is also used to clock the serial shifting of the scan-input latches 154 and 70–72, as well as the scan-output latches 158 and 76–78. The wait signal 63 is received by the scan-inputs latches 70–72 and is used to selectively disable the shifting of the scan-input latches 70–72. In alternate embodiments of the present invention, more, fewer, or different test signals 32 may be used to coordinate the BIST scan testing of modules 24–26.

For purposes of illustration, the following example will assume that the circuit under test 73 is selected and the circuits under test 74 and 75 are not selected. Thus, only the circuit under test 73 will operate and will be tested. The activate signal 65 is now asserted (see rectangle 377 in FIG. 6). The assertion of the activate signal 65 causes the circuits under test 73–75 which are selected, namely circuit under test 73, to operate. Circuit under test 73 receives the pseudo-random bits from scan-input latches 76 and generates corresponding output bits which are loaded and stored in scan-output latches 76. The activate signal 65 is then negated (see rectangle 379 in FIG. 6).

Figure 7:
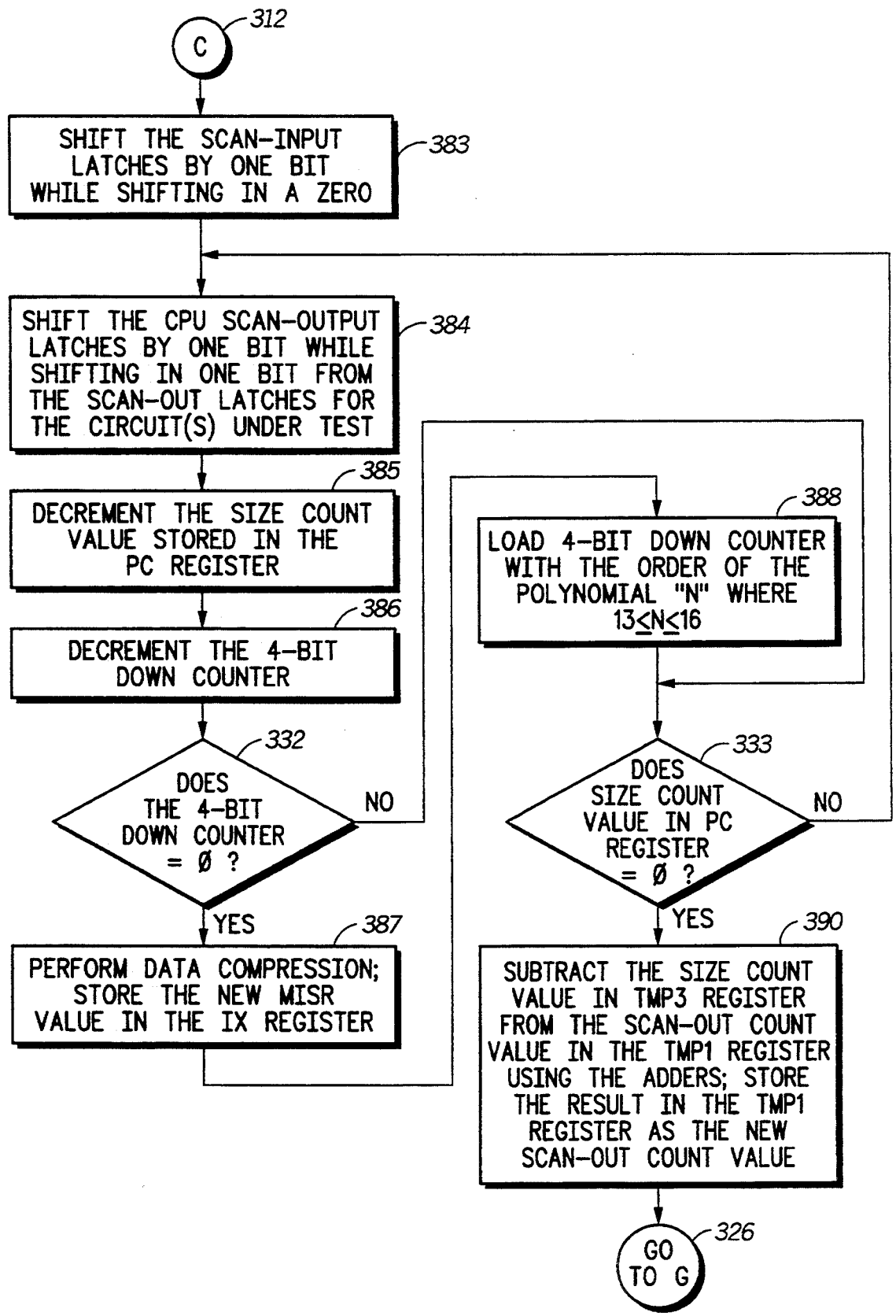

To prepare for the next test, scan-input latches 154 and 70 are shifted by one bit simultaneously (see rectangle 383 in FIG. 7). The shift-out bit from scan-input latches 70 may or may not be shifted on to module 25. In one embodiment of the present invention, a new pseudo-random bit is not generated by CPU 20. Instead, a fixed value (i.e. either a logic zero value or a logic one value) is loaded into scan-input latches 154 across conductor 156 as the shift-in bit.

However, before the next test on circuit under test 73 can be performed, the outputs from circuit under test 73, which are stored in scan-output latches 76, must be preserved. In one embodiment of the present invention, the outputs from circuit under test 73 are transferred to CPU 20 by shifting the scan-output latches 76 and 158 a predetermined number of bits "N". In one embodiment of the present invention, "N" may be the integer 13, 14, 15, or 16. Alternate embodiments of the present invention may use any positive integer for the value of "N".

"N" is the number of bits which are compressed at one time. Thus "N" bits are serially shifted into scan-output latches 158 from scan-output latches 76. These "N" bits are compressed, and then the next "N" bits are serially shifted into scan-output latches 158 from scan-output latches 76. "N" bits at a time are shifted into CPU 20 and compressed until all of the output bits from scan-output latches 76 have been received and compressed by CPU 20.

Note that if "N" is greater than the number of outputs from circuit under test 73, then fewer than "N" shifts will be performed after each test. Only the number of shifts required to transfer the outputs from circuit under test 73 to CPU 20 will be performed. A subsequent test of circuit under test 73 is then performed to generate a new set of outputs from circuit under test 73. Data compression only occurs after a total of "N" outputs from circuit under test 73 have been transferred to CPU 20.

The purpose of the data compression is to compress the very long string of output bits from the scan-output latches 76 into a few number of bits, for example, a 16-bit signature value which can be stored in a register. The signature value is then compared to the expected result. If the signature value is different than the expected result, circuit under test 73 has failed the test. If the signature value is the same as the expected result, the circuit under test 73 has passed the test.

Figure 5:
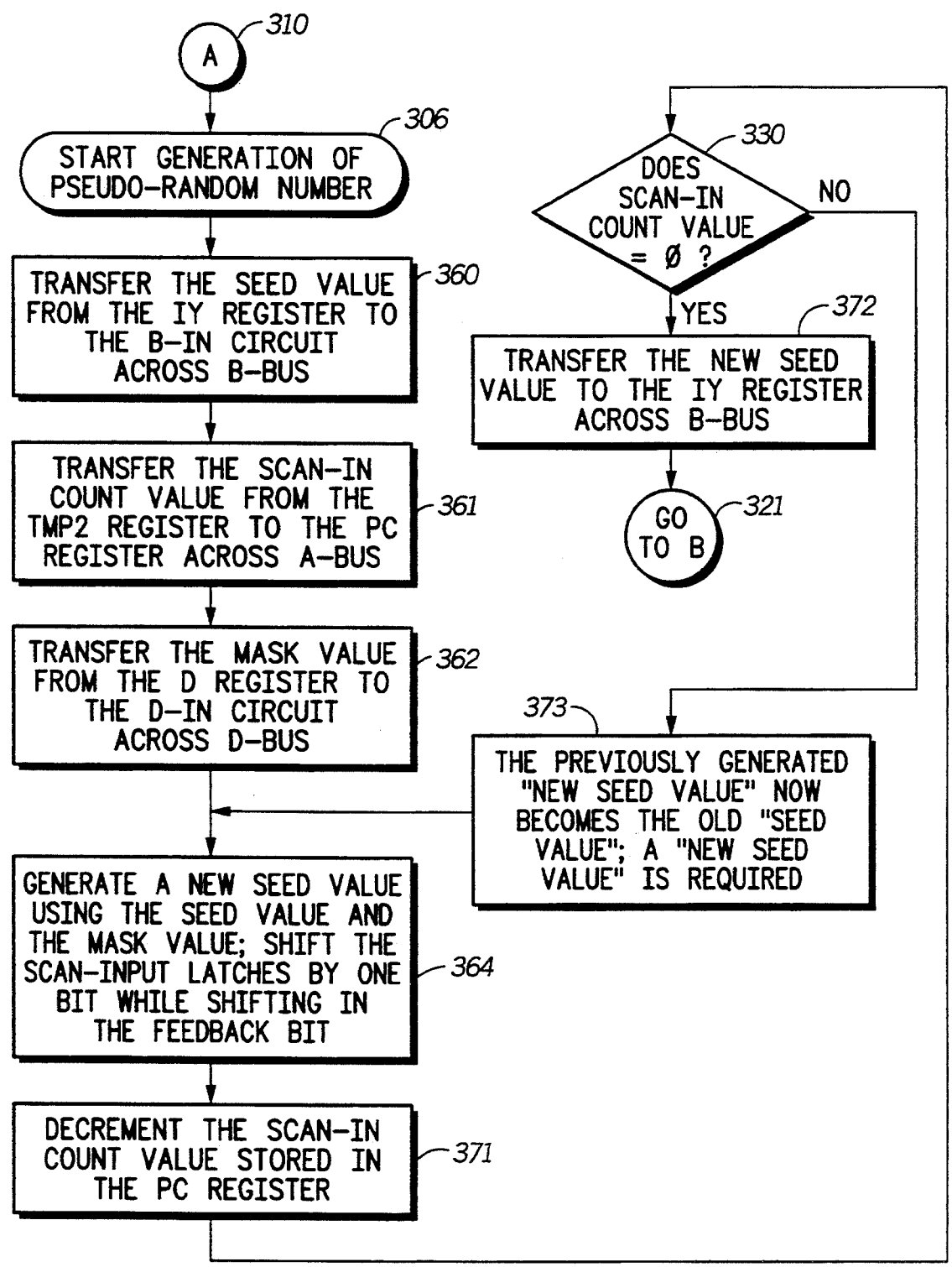

The manner in which the pseudo-random numbers, and thus the pseudo-random bits, are generated will now be discussed. Referring to FIG. 5, flattened oval 306 indicates the point in the flow diagram where the generation of pseudo-random numbers is started. Rectangles 360–362 illustrate data movement steps which properly initialize CPU 20 so that pseudo-random numbers can be generated. A SEED value and a MASK value are received by arithmetic logic unit (ALU) 152. The SEED value and the MASK value are used to generate a pseudo-random number which is then used as a "NEW SEED" value to generate the next pseudo-random number (see rectangle 364 in FIG. 5).

Using the following steps in TABLE 1, pseudo-random numbers are generated in accordance with one embodiment of the present invention. Note that each of the four steps in TABLE 1 is illustrated in FIG. 9 as a rectangle 400 and 402–404 in the flow diagram. Step 1 corresponds to rectangle 400; step 2 corresponds to rectangle 402; step 3 corresponds to rectangle 403; and step 4 corresponds to rectangle 404. Note that the steps illustrated by rectangles 400 and 401 in FIG. 9 may be performed concurrently. Note also that the four steps illustrated in TABLE 1 may be performed by combinational or clocked circuitry.

The binary numbers in TABLE 1 are included as an illustrative example of how each step is performed. The SEED values, including old SEED and NEW SEED represent individual numbers in a sequence of pseudo-random numbers.

TABLE 1

| step 1) | generate SHIFTED SEED, FEEDBACK BIT | |
|---|---|---|
| | SEED = | 1101 1110 0011 1010 |
| | SHIFTED SEED = | 1011 1100 0111 0100 |
| | FEEDBACK BIT = | 1 |
| step 2) | replicate FEEDBACK BIT | |
| | REPLICATED FEEDBACK = | 1111 1111 1111 1111 |
| step 3) | perform an AND operation | |
| | RELPICATED FEEDBACK (&) | 1111 1111 1111 1111 |
| | MASK | 0011 0100 0110 1111 |
| | = INTER. RESULT | 0011 0100 0110 1111 |
| step 4) | generate NEW USED | |
| | INTER. RESULT (XOR) | 0011 0100 0110 1111 |
| | SHIFTED SEED | 1011 1100 0111 0100 |
| | = NEW SEED | 1000 1000 0001 1011 |

The FEEDBACK BIT is transferred to feedback latch 151 and scan-input latches 154 by way of conductor 156. Thus one bit of each NEW SEED value is used as one pseudo-random bit for scan-in latches 70–72. If no more pseudo-random bits are required by scan-input latches 70–72, then the NEW SEED value is stored back in the IY register 101 (see rectangle 373 in FIG. 5). Referring to rectangle 371 and diamond 330 in FIG. 5, the SCAN-IN COUNT value is used to determine how many times the scan-input latches 154 are shifted, and thus how many pseudo-random bits must be generated by CPU 120.

Referring to TABLE 1, FIG. 5, and FIG. 9, each of the above four steps for generating pseudo-random numbers will now be described in detail.

The first step is a simple shift operation in which the SEED value is left-shifted one bit place by the shift circuit 134 in B-in circuit 131. Note that the least significant bit (LSB) of SEED is left-shifted out and is used as the FEEDBACK BIT. A binary zero is right-shifted in as the new most significant bit (MSB). In one implementation of the present invention, the least significant bit of the SEED value is stored in bit-15 of B-bus latches 115 and is directly transferred to D-in circuit 132 as the FEEDBACK BIT.

The second step is a simple replicate operation. The FEEDBACK BIT is only one bit in length, whereas the MASK value is 16 bits in length. In order to logically AND the FEEDBACK BIT and the MASK value, the FEEDBACK BIT must be extended to 16 bits. In one implementation of the present invention, the replicating circuit 138 in D-in circuit 132 is merely a storage circuit which is coupled to all sixteen bits of the 16-bit wide logical ANDing circuit 140 in D-in circuit 132.

The third step is a simple logical AND operation in which the REPLICATED FEEDBACK value is logically ANDed with the MASK value by the logical ANDing circuit 140 in D-in circuit 132. The result of the logical ANDing operation is called the INTERMEDIATE RESULT (i.e. INTER. RESULT), which is input to the second input of adder circuit 144.

The fourth step is a 2-input exclusive-OR (XOR) operation in which the INTERMEDIATE RESULT value is exclusive-ORed with the SHIFTED SEED value by adder circuits 142 and 144. In one embodiment of the present invention, the 2-input exclusive-OR operation is carried out in the following manner. The input zero circuit 136 provides zeros to all sixteen bits of the 16-bit wide first input of adder circuit 142. The shift circuit 134 provides the SHIFTED SEED value to all sixteen bits of the 16-bit wide second input of adder circuit 142.

In one embodiment of the present invention, adder circuit 142 merely passes the SHIFTED SEED value through unchanged. In alternate embodiments of the present invention, the SHIFTED SEED value could be passed through adder circuit 142 in a variety of ways. For example, SHIFTED SEED could be logically ORed with all zeros, logically ANDed with all ones, all zeros could be added, and all zeros could be subtracted.

Adder circuit 144 thus receives the INTERMEDIATE RESULT value at its first 16-bit input, and the SHIFTED SEED value at its second 16-bit input. Adder circuit 144 then exclusive-ORs the SHIFTED SEED value and the INTERMEDIATE RESULT value to produce a NEW SEED value. The NEW SEED value is output by adder circuit 144 and stored in latches 146.

In one implementation of the present invention, adder circuit 142 and 144 are standard 16-bit wide half-adder circuits which have a special input for carry kill signals 148. The carry kill signals 148 are used to block each carry-out signal from one adder stage to the next. In one embodiment of the present invention, adder circuit 144 performs a logical exclusive-OR operation by adding the INTERMEDIATE RESULT value and the SHIFTED SEED value while inhibiting or killing any carry-out signal which is generated by any adder stage. Thus when performing an exclusive-OR operation, only one global carry kill signal 148 is required which causes every carry out signal in adder 144 to be inhibited.

Although the MASK value and the SEED value in the illustrated embodiment of the present invention are each sixteen bits, any convenient number of bits could have been used. Test control circuitry 120 uses control signals 150 to control the operation of ALU 152 during the generation of the pseudo-random numbers.

Note that in an alternate embodiment of the present invention, two passes through a standard arithmetic logic unit (ALU) may be used in order to generate each pseudo-random number. For example, the first pass through the ALU may perform the shifting and logical ANDing operations of steps 1–3. The second pass through the ALU may perform the exclusive-ORing operation of step 4. In alternate embodiments of the present invention, the left-shift operation may be replaced with a right shift operation. In yet other embodiments, adder circuits 142 and 144 may be replaced with one adder circuit.

Using data bus 28 and address bus 30, a user can load a desired SEED value into IY register 101. Once a user programs an initial SEED value into IY register 101, the SEED value stored in IY register 101 is updated by CPU 20 after each set of pseudo-random bits has been generated for the scan-input latches 70–72 which are selected. The user may, but need not, change the SEED value in the IY register 101 between scan tests by writing a new value into IY register 101.

Also, using data bus 28 and address bus 30, a user can load a desired MASK value into D register 102. Once a user programs an initial MASK value into D register 102, the MASK value stored in D register 102 is not changed or affected by the pseudo-random number generation procedure which is described in TABLE 1 above. The user may, but need not, change the MASK value in the D register 102 by writing a new value into D register 102.

The MASK value is used to select, under program control, which polynomial is to be used in the generation of the pseudo-random numbers. The MASK value is used to determine the coefficients of the polynomial. For each bit location of MASK that has a binary zero value, the corresponding coefficient of the polynomial is zero. And for each bit location of MASK that has a binary one value, the corresponding coefficient of the polynomial is one.

In one embodiment of the present invention, the four steps described in TABLE 1 herein above may together form one instruction which can be executed by CPU 20. Thus, this one instruction may be executed each time that a new pseudo-random number is to be generated. So in order to generate "M" pseudo-random numbers, this one instruction is executed M times. This one instruction may be used as part of a software loop which allows the instruction to execute a selected number of times.

Alternately, each of the four steps, or portions of the four steps may be divided up into one or more instructions which may be used together to perform the four steps described in TABLE 1.

Alternately, one instruction may include a parameter, possibly in the form of a bit field, which designates how many times the four steps in TABLE 1 are to be repeated, thus how many pseudo-random numbers are to be generated for one execution of the instruction. Thus one instruction may be used to generate a plurality of pseudo-random numbers.

Note that the SEED value and the MASK value may be used as arguments for an instruction which executes the four steps described in TABLE 1. The instruction itself may include the SEED value as a field and the MASK value as a field. If the SEED and MASK values are part of the instruction itself, then the D register 102 and the IY register 101 may act as temporary storage for the instruction fields.

Alternately, two register locations, such as data register 0 and data register 1, may be used as arguments for an instruction which executes the four steps described in TABLE 1. In this case, the two registers which are designated must be preloaded with the desired values of SEED and MASK. Alternately, an instruction which executes the four steps in TABLE 1 may not require any arguments, but may merely use the existing value stored in a first predetermined storage location as the SEED value and the existing value stored in a second predetermined storage location as the MASK value.

The manner in which the data is compressed will now be discussed. Referring to FIG. 7, rectangle 387 represents the point in the flow diagram where data compression is performed. FIG. 10 illustrates in more detail some of the steps which are carried out during data compression. Rectangles 410–412 illustrate data movement steps which properly initialize CPU 20 so that data compression can be performed. Rectangles 413–416 illustrate steps used to perform data compression.

A MISR value, a MASK value, and a SCAN-OUT value are received by arithmetic logic unit (ALU) 152. Note that the SCAN-OUT value is the value stored in scan-output latches 158 (see FIG. 3). The MISR value, the MASK value, and the SCAN-OUT value are used to generate a compressed result. The compressed result is then used as a "NEW MISR" value in performing the next data compression. The MASK value is also received by down counter 128. When down counter 128 receives a load signal 130 from test control circuitry 120, down counter 128 uses the MASK value to determine an initial count value to load into down counter 128.

Using the following steps in TABLE 2, data compression is performed in accordance with one embodiment of the present invention. Note that each of the four steps in TABLE 2 is illustrated in FIG. 10 as a rectangle 413–416 in the flow diagram. Step 1 corresponds to rectangle 413; step 2 corresponds to rectangle 414; step 3 corresponds to rectangle 415; and step 4 corresponds to rectangle 416. Note also that the four steps illustrated in TABLE 2 may be performed by combinational or clocked circuitry.

The binary numbers in TABLE 2 are included as an illustrative example of how each step is performed. The MISR values, including old MISR and NEW MISR represent a compressed result. Note that the same MASK value may be used for pseudo-random number generation and for data compression. Alternately, different MASK values may be used for pseudo-random number generation and for data compression.

TABLE 2

| step 1) | generate SHIFTED MISR, FEEDBACK BIT | |
|---|---|---|
| | MISR = | 0110 0011 1010 0001 |
| | SHIFTED MISR = | 1100 0111 0100 0010 |
| | FEEDBACK BIT = | 0 |
| step 2) | replicate FEEDBACK BIT | |
| | REPLICATED FEEDBACK = | 0000 0000 0000 0000 |
| step 3) | perform an AND operation | |
| | REPLICATED FEEDBACK (&) | 0000 0000 0000 0000 |
| | MASK | 1010 1001 1110 0110 |
| | = INTER. RESULT | 0000 0000 0000 0000 |
| step 4) | generate NEW MISR | |
| | INTER. RESULT (XOR) | 0000 0000 0000 0000 |
| | SHIFTED MISR (XOR) | 1100 0111 0100 0010 |
| | SCAN-OUT | 0101 0011 1110 0110 |
| | = NEW MISR | 1001 0100 1010 0100 |

If no more scan-out data bits from scan-out latches 76–78 need to be compressed after completion of a scan test, the NEW MISR value is stored back in the IX register 100 (see rectangle 387 in FIG. 7). Referring to rectangle 390 and diamond 333 in FIG. 7, and to diamond 331 in FIG. 6, the SCAN-OUT COUNT value and the SIZE COUNT value are both used to determine how many data compressions are performed. ALU 152 is used to subtract the SIZE COUNT value from the running SCAN-OUT COUNT value stored in the TMP3 register 105. Note that the SIZE COUNT value had previously been transferred from TMP3 register 105 to program counter (PC) register 106 (see rectangle 376 in FIG. 6) so that the SIZE COUNT value could be decremented by the decrement circuitry in PC register 106 (see rectangle 385 in FIG. 7).

The SCAN-OUT COUNT value, stored in the TMP1 register 103 represents the total number of shifts that must be executed by scan-output latches 158 during all of the scan tests performed on one selected circuit under test 73–75. The SIZE COUNT value represents the total number of scan-out data bits from the selected circuit under test 73–75 for one scan test. The SIZE COUNT value is determined by the hardware configuration of the selected circuit under test 73–75. The SCAN-OUT COUNT value may be larger than the SIZE COUNT value, or the SIZE COUNT value may be larger than the SCAN-OUT COUNT value.

The MASK value stored in the D register 102 is transferred to down counter 128 across D-bus 113. Down counter 128 uses the MASK value to determine the Order of the polynomial for the data compression; and thus to determine how many scan-out data bits are compressed at one time. The most significant bit place of the MASK value which stores a logical one determines the number of bits which are compressed at a time. In one embodiment of the present invention, the number of bits which can be compressed at one time is an integer value from one to sixteen, which is the width of ALU 152. In an alternate embodiment of the present invention, the number of bits which can be compressed at one time is an integer value from thirteen to sixteen.

Test control circuitry 120 controls the loading of down counter 128 by way of load signal 130. If the most significant bit place of the MASK value which stores a logical one is the "Nth" bit, then the value "N" is loaded into down counter 128. For example, if the most significant bit place of the MASK value which stores a logical one is the "14th" bit, then the value "14" is loaded into down counter 128. Down counter is then decremented (see rectangle 386 in FIG. 7) until down counter 128 reaches a zero value. When down counter 128 reaches a zero value, down counter 128 asserts a zero count signal 126. Note that alternate embodiments of the present invention may use an up counter with match circuitry (not shown) instead of down counter 128.

Figure 6:
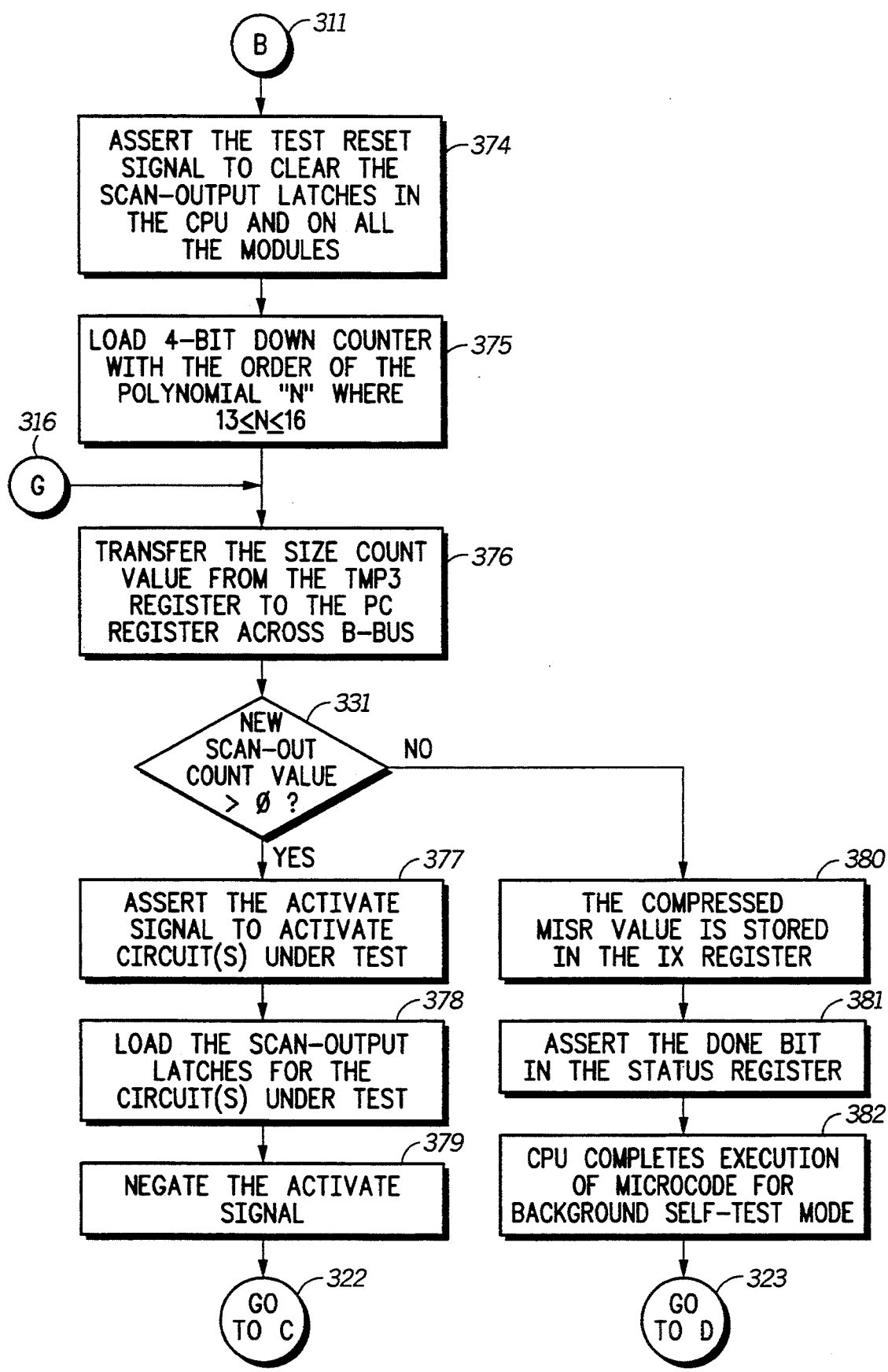

Referring to TABLE 2, FIGS. 6–7, and FIG. 10, each of the above four steps for performing data compression will now be described in detail.

The first step is a simple shift operation in which the MISR value is left-shifted one bit place by the shift circuit 134 in B-in circuit 131. Note that the least significant bit (LSB) of MISR is left-shifted out and is used as the FEEDBACK BIT. A binary zero is right-shifted in as the new most significant bit (MSB). In one implementation of the present invention, the least significant bit of the MISR value is stored in bit-15 of B-bus latches 115 and is directly transferred to D-in circuit 132 as the FEEDBACK BIT.

The second step is a simple replicate operation. The FEEDBACK BIT is only one bit in length, whereas the MASK value is 16 bits in length. In order to logically AND the FEEDBACK BIT and the MASK value, the FEEDBACK BIT must be extended to 16 bits. In one implementation of the present invention, the replicating circuit 138 in D-in circuit 132 is merely a storage circuit which is coupled to all sixteen bits of the 16-bit wide logical ANDing circuit 140 in D-in circuit 132.

The third step is a simple logical AND operation in which the REPLICATED FEEDBACK value is logically ANDed with the MASK value by the logical ANDing circuit 140 in D-in circuit 132. The result of the logical ANDing operation is called the INTERMEDIATE RESULT value (i.e. INTER. RESULT), which is input to the second input of adder circuit 144.

The fourth step is a 3-input exclusive-OR (XOR) operation in which the INTERMEDIATE RESULT value, the SHIFTED MISR value, and the SCAN-OUT value are exclusive-ORed together by adder circuits 142 and 144. In one embodiment of the present invention, the 3-input exclusive-OR operation is carried out in the following manner. The SCAN-OUT value is provided to the first input of adder circuit 142. The SHIFTED MISR value is provided to the second input of adder circuit 142. And, the INTERMEDIATE RESULT value is provided to the second input of adder circuit 144.

Adder circuit 142 exclusive-ORs the SCAN-OUT value and the SHIFTED MISR value and provides the result of the exclusive-OR operation at the second input of adder circuit 144. Adder circuit 144 then exclusive-ORs the result from adder circuit 142 and the INTERMEDIATE RESULT value to produce a NEW MISR value. The NEW MISR value is output by adder circuit 144 and stored in latches 146.

In one implementation of the present invention, adder circuit 142 and 144 are standard 16-bit wide half-adder circuits which have a special input for carry kill signals 148. The carry kill signals 148 are used to block each carry-out signal from one adder stage to the next. In one embodiment of the present invention, adder circuit 142 performs a logical exclusive-OR operation by adding the SCAN-OUT value and the SHIFTED MISR value while inhibiting or killing any carry-out signal which is generated by any adder stage. Likewise, adder circuit 144 performs a logical exclusive-OR operation by adding the result value from adder circuit 142 to the INTERMEDIATE RESULT value while inhibiting or killing any carry-out signal which is generated by any adder stage. Thus when performing an exclusive-OR operation, only one global carry kill signal 148 is required which causes every carry out signal in adders 142 and 144 to be inhibited.

By performing multiple tests on the same circuit under test 73–75 and by using a programmable MASK value (i.e. a multiple polynomial MISR), the probability of aliasing can be reduced. Although the MASK value and the MISR value in the illustrated embodiment of the present invention are each sixteen bits, any convenient number of bits could have been used. Test control circuitry 120 uses control signals 150 to control the operation of ALU 152 during the steps to perform data compression.

Note that in an alternate embodiment of the present invention, two passes through a standard arithmetic logic unit (ALU) may be used in order to generate each pseudo-random number. For example, the first pass through the ALU may perform the shifting and logical ANDing operations of steps 1–3. The second pass through the ALU may perform the exclusive-ORing operation of step 4. In alternate embodiments of the present invention, the left-shift operation may be replaced with a right shift operation.

Using data bus 28 and address bus 30, a user can load a desired MISR value into IX register 100. Once a user programs an initial MISR value into IX register 100, the MISR value stored in IX register 100 is updated by CPU 20 after each complete set of scan-output data bits for a scan test has been compressed. Note that some embodiments of the present invention may update the IX register 100 with the NEW MISR value after each individual data compression. The user is capable of changing the MISR value in the IX register 100 between scan tests by writing a new value into IX register 100. However, doing so will most likely corrupt the data compression result.

Also, using data bus 28 and address bus 30, a user can load a desired MASK value into D register 102. Once a user programs an initial MASK value into D register 102, the MASK value stored in D register 102 is not changed or affected by the pseudo-random number generation procedure which is described in TABLE 1 above. The user is capable of changing the MASK value in the D register 102 between scan tests by writing a new value into the D register 102.

In one embodiment of the present invention, the four steps described in TABLE 2 herein above may together form one instruction which can be executed by CPU 20. Thus, this one instruction may be executed each time that a data compression on a new set of data bits is to be performed. So in order to perform "M" data compressions, this one instruction is executed M times. This one instruction may be used as part of a software loop which allows the instruction to execute a selected number of times.

Alternately, each of the four steps, or portions of the four steps may be divided up into one or more instructions which may be used together to perform the four steps described in TABLE 2.

Alternately, one instruction may include a parameter, possibly in the form of a bit field, which designates how many times the four steps in TABLE 2 are to be repeated, thus how many data compressions are to be performed for one execution of the instruction. Thus one instruction may be used to perform a plurality of data compressions.

Note that the MISR value and the MASK value may be used as arguments for an instruction which executes the four steps described in TABLE 2. The instruction itself may include the MISR value as a field and the MASK value as a field. If the MISR and MASK values are part of the instruction itself, then the D register 102 and the IX register 100 may act as temporary storage for the instruction fields.

Alternately, two register locations, such as data register 0 and data register 1, may be used as arguments for an instruction which executes the four steps described in TABLE 2. In this case, the two registers which are designated must be preloaded with the desired values of MISR and MASK. Alternatively, an instruction which executes the four steps in TABLE 2 may not require any arguments, but may merely use the existing value stored in a first predetermined storage location as the MISR value and the existing value stored in a second predetermined storage location as the MASK value.

The test environment of the present invention will now be discussed. Referring to FIG. 1, in one embodiment of the present invention, data processor 12 is an integrated circuit which is being tested. Host computer 16 is used to control the testing from a high level. Host computer 16 may be a mainframe computer, a workstation computer, a personal computer, or even a mere terminal. Interface circuitry 14 may be a simple microprocessor board having the necessary software for communicating with data processor 12. In some embodiments of the present invention, interface circuitry 14 may be incorporated as part of host computer 16.

Data processor 12 receives power (VDD) and ground voltages from power supply 18. In some embodiments of the present invention, data processor 12 also receives a high voltage level (VPP) from power supply 18. The high voltage level (VPP) can be used by data processor 12 for a variety of purposes, including the programming and erasing of on-board non-volatile memory such as EEPROM and flash EPROM. For example, module 26 may be a flash EPROM module.

In one embodiment of the present invention, interface circuitry 14 provides a reset signal 56 and a clock signal 57 to data processor 12. In one embodiment, interface circuitry 14 and data processor 12 communicate by way of one or more bi-directional data I/O signals 58. In an alternate embodiment, interface circuitry 14 and data processor 12 communicate by way of a bi-directional background mode signal 59.

In one embodiment of the present invention, the self-test capabilities of the present invention are used during a background debug mode. The background debug mode is a mode which has been implemented on the MC68HC300 family of microcontrollers (available from Motorola, Inc. of Austin, Tex.). The background debug mode allows registers in CPU 20 to be read or written to, and allows test features to be invoked.

Data processor 12 enters background debug mode when the background mode signal 59 is asserted while the reset signal 56 is asserted. The background mode signal 59 is then used as an input/output signal for serial communications between data processor 12 and interface circuitry 14. Interface circuitry 14 can transfer commands (i.e. background mode instructions), addresses, and data to data processor 12 by way of background mode signal 59. The background mode instructions are decoded and executed by CPU 12. In one embodiment of the present invention, the control circuitry for background mode commands 53 uses microcode 54 to implement the control for one or more of the background instructions. Alternate embodiments of the present invention may use random logic instead of microcode 54.

The present invention adds a special "background self-test mode" to the existing background debug mode. In one embodiment of the present invention, background debug mode must be entered first (see rectangle 350 in FIG. 4). Then by transferring a predetermined value, $07 in one embodiment of the present invention, the special "background self-test mode" is entered (see rectangle 351 in FIG. 4). The registers 100–105 in CPU 20 must then be properly initialized for the self-test (see rectangle 352 in FIG. 4).

Figure 4:
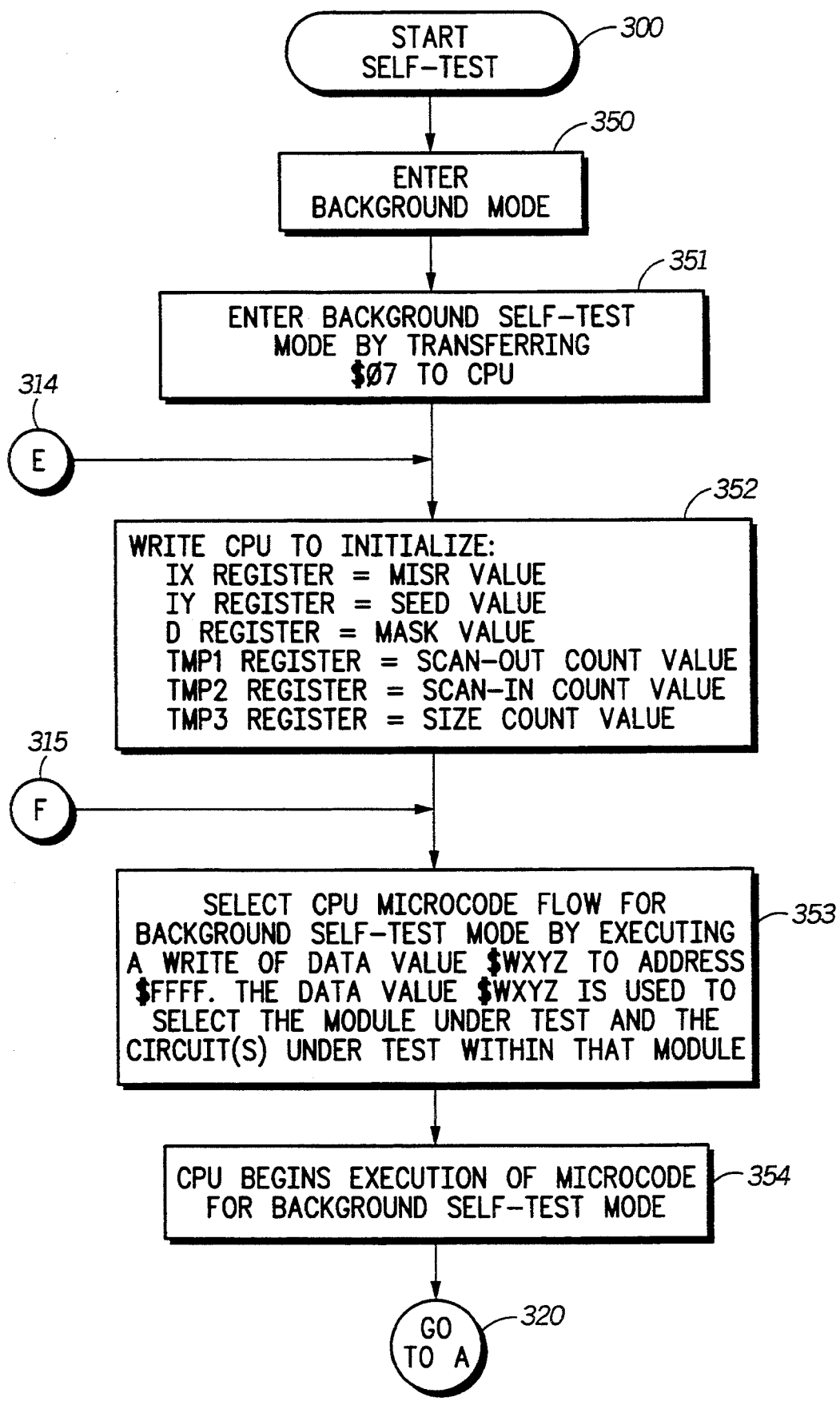
FIGS. 4–8 illustrate, in flow diagram form, a method for performing BIST scan testing of data processor 12, including generating pseudo-random numbers and performing data compression in accordance with one embodiment of the present invention.

The CPU microcode flow for the special "background self-test mode" is selected and initiated by executing a write of a data value to address $FFFF (see rectangles 353 and 354 in FIG. 4). The data value is used to determine which module 24–26, as well as which circuits under test 73–75, will be selected for this particular test. Note that in some embodiments of the present invention, each module 24–26 will have a plurality of circuits under test, rather than just one circuit under test as illustrated in FIG. 2.

Referring to FIG. 5, CPU 20 generates the pseudo-random data bits which will be used as inputs to the circuits under test 73–75 which have been selected. The scan-in signal 60 is used to transfer the pseudo-random data bits to the circuits under test 73–75 which have been selected. Referring to FIG. 6, the test clock signal 62, the wait signal 63, the test reset signal 64, and the activate signal 65 are used to control the actual test itself of the circuits under test 73-75. The result of the actual test are the outputs from the circuits under test 73-75. The scan-out signal 61 is used to transfer the scan-out data bits from the circuits under test 73-75 to CPU 20. Referring to FIG. 7, data compression is then performed on the scan-out data bits received by the scan-output latches 158 in CPU 20.

The pseudo-random data bits are then shifted one bit place, with a zero bit shifted into scan-input latches 154. In this manner, the inputs to the circuits under test 73-75 are changed. A second actual test is then performed of the circuits under test 73-75. The test clock signal 62, the wait signal 63, the test reset signal 64, and the activate signal 65 are used to control the second actual test itself of the circuits under test 73-75. The result of the second actual test are the outputs from the circuits under test 73-75. The scan-out signal 61 is used to transfer the scan-out data bits from the circuits under test 73-75 to CPU 20. Referring to FIG. 7, data compression is then performed on the scan-out data bits received by the scan-output latches 158 in CPU 20. The pseudo-random data bits are then shifted one bit place, with a zero bit shifted into scan-input latches 154, and the whole procedure is repeated in order to perform a third test.

Referring to rectangle 390 in FIG. 7, the NEW SCAN-OUT COUNT value is a running total of the remaining number of shifts that still must be executed by scan-output latches 158 during the remaining scan tests yet to be performed on the selected circuit under test 73-75. Referring to diamond 331 in FIG. 6, when the NEW SCAN-OUT COUNT value is no longer a positive integer, the BIST scan testing of the selected circuit under test 73-75 has been completed. The compressed MISR value is stored in IX register 100. The DONE bit 124 is asserted to indicate that the scan tests and the data compression have been completed.

If more scan tests are to be performed, new values are written into registers 100-105 by way of the background mode signal 59 (see diamonds 334 and 335 in FIG. 8). If BIST scan testing has been completed, interface circuitry 14 transfers a predetermined value, $A0 in one embodiment of the present invention, the special "background self-test mode" and the background debug mode are both exited (see rectangle 391 in FIG. 8).

Once data processor 12, and thus CPU 20, exits special "background self-test mode" and background debug mode, normal CPU 20 operation can resume and the circuitry in CPU 20 can execute normal operating mode instructions.

In summation, the above specification describes a method and apparatus for performing BIST scan testing using the circuitry in CPU 20. CPU 20 can be used to generate pseudo-random numbers, and can be used to perform data compression. The pseudo-random numbers can be used to generate a plurality of pseudo-random bits which can be used as scan-input data. The data compression can be performed on the plurality of scan-out data bits which are produced by the BIST scan testing.

The present invention allows the user to select, under program control, the MASK value which determines the polynomial to be used to generate the pseudo-random numbers and the polynomial used to perform the data compression. The present invention also allows the user to select the initial SEED value and the initial MISR value under program control.

In one embodiment of the present invention illustrated in FIG. 3, all of the circuitry but the scan-input latches 154, the scan-output latches 158, the down counter 128, the DONE bit 124, conductor 157, D-bus 113, logical ANDing circuit 140, replicating circuit 138, test signal 32, and test control logic 120 were already being used by CPU 20 for other functions in a normal operating mode which were unrelated to the present invention. Thus by adding a relatively small amount of circuitry, CPU 20 was now able to perform BIST scan testing, which included the generation of pseudo-random numbers and the performance of data compression.

While the present invention has been illustrated and described with reference to specific embodiments, further modifications and improvements will occur to those skilled in the art. For example, various circuits could be used to implement any of the circuits illustrated in FIGS. 1-3. A different bus structure could be used in CPU 20. In one embodiment of the present invention, buses 110-113, registers 100-106, ALU 152, and other circuitry in CPU 20 are 16-bits wide. Alternate embodiments of the present invention may use other data sizes. Other circuitry and logic (not shown) may be included in CPU 20 and may be coupled to various busses. In alternate embodiments of the present invention, feedback latch 151 may be implemented using one of the existing B-bus latches 115 in bus interface circuitry 55.

In an alternate embodiment of the present invention, scan-input latches 154 may be removed. Thus as each pseudo-random bit is generated, the pseudo-random bit may be shifted directly to the scan-input latches 70-72 in modules 24-26.

Likewise, in an alternate embodiment of the present invention, scan-output latches 158 may be removed. Thus, modules 24-26 may be used to directly drive A-bus 110, and ALU 152 may be used to perform the shifting function.

In addition to generating test patterns for a data processor, pseudo-random numbers can be used for a variety of other purposes. For example, pseudo-random numbers can be used to represent noise in a data processing system. Also, pseudo-random numbers can be used to generate an initial state or value which acts as a pseudo-random starting point from which to start calculations. Some neural network systems require this type of pseudo-random starting point from which to start calculations. In addition, pseudo-random numbers may be used in data encryption and decryption. There are also other uses for pseudo-random numbers.

Modules 24-26 can be separate functional blocks such as timers, memory, serial systems, etc. Alternately, modules 24-26 may be arbitrary sections of circuitry which have been divided for the purposes of testing. For example, module 24 may be a programmable logic array (PLA), module 25 may be a portion of random circuitry, and module 26 may be a memory array. Alternate embodiments of the present invention may have any number of modules.

Note also that (REPLICATED FEEDBACK & MASK), the complemented value of (REPLICATED FEEDBACK & MASK), may be used in place of (REPLICATED FEEDBACK & MASK) in generating the NEW SEED value. (REPLICATED FEEDBACK & MASK) is the Boolean logic equivalent of logically ORing REPLICATED FEEDBACK with MASK. Thus the step of performing a logical AND operation using REPLICATED FEEDBACK and MASK as the operands may be replaced with the step of performing a logical OR operation using $\overline{\text{REPLICATED FEEDBACK}}$ and $\overline{\text{MASK}}$ as the operands. Thus, ALU 152 may perform a logical OR operation rather than a logical AND operation. In either case, however, ALU 152 performs a logical combination of either a true or complement value of a REPLICATED FEEDBACK value and a MASK value.

In addition to (REPLICATED FEEDBACK & MASK) and ($\overline{\text{REPLICATED FEEDBACK}}$ OR $\overline{\text{MASK}}$), other combinations of logical functions and complimentary or non-complementary values may be used, such as (REPLICATED FEEDBACK & $\overline{\text{MASK}}$),
($\overline{\text{REPLICATED FEEDBACK}}$ & MASK),
($\overline{\text{REPLICATED FEEDBACK}}$ & $\overline{\text{MASK}}$),
(REPLICATED FEEDBACK OR MASK),
(REPLICATED FEEDBACK OR $\overline{\text{MASK}}$), or
($\overline{\text{REPLICATED FEEDBACK}}$ OR MASK).

One embodiment of adder circuit 142 (see FIG. 3) uses sixteen half-adder stages (not shown). Each half-adder stage (not shown) has a carry kill input. When the carry kill input is asserted, the carry-out signal from the half-adder stage is inhibited. One embodiment of adder circuit 144 (see FIG. 3) uses sixteen half-adder stages (not shown). Each half-adder stage (not shown) has a carry kill input. When the carry kill input is asserted, the carry-out signal from the half-adder stage is inhibited. In alternate embodiments of the present invention, ALU 152 may be implemented in any manner which allows the functions in TABLES 1 and 2, or their equivalents, to be performed.

In addition to performing data compression on test results for a data processor 12, data compression can be used for a variety of other purposes, for example, many types of communications (e.g. satellite communications), data encryption and decryption, video and graphics, etc.

It is to be understood, therefore, that this invention is not limited to the particular forms illustrated and that it is intended in the appended claims to cover all modifications that do not depart from the spirit and scope of this invention.

We claim:

1. A method for operating a data processor having an arithmetic logic unit, comprising the steps of:
   executing an instruction using said arithmetic logic unit while the data processor is in a normal operating mode;
   placing the data processor in a special test mode;
   while the data processor is in the special test mode, generating a plurality of pseudo-random bits using said arithmetic logic unit;
   while the data processor is in the special test mode, performing a scan test using the plurality of pseudo-random bits as at least a portion of a plurality of scan input data bits and producing a scan test result; and
   while the data processor is in the special test mode, performing data compression of the scan test result using said arithmetic logic unit.

2. The method according to claim 1, wherein said step of placing the data processor in the special test mode comprises the step of:
   receiving an asserted signal at an integrated circuit bonding pad while the data processor is in reset.

3. The method according to claim 2, wherein said step of placing the data processor in the special test mode further comprises the step of:
   receiving a predetermined value at the integrated circuit bonding pad.

4. The method according to claim 1, wherein said step of generating a plurality of pseudo-random bits comprises the steps of:
   shifting a first value to produce a shifted first value and a feedback bit; and
   using the feedback bit as a first one of the plurality of pseudo-random bits.

5. The method according to claim 4, wherein said step of generating a plurality of pseudo-random bits further comprises the steps of:
   replicating the feedback bit to produce a replicated feedback value; and
   logically combining the replicated feedback value and a second value to produce an intermediate value.

6. The method according to claim 5, wherein said step of logically combining the replicated feedback value and the second value comprises the step of:
   logically ANDing the replicated feedback value and the second value.

7. The method according to claim 5, further comprising the steps of:
   storing the first value in a first register; and
   storing the second value in a second register.

8. The method according to claim 5, wherein said step of generating a plurality of pseudo-random bits further comprises the step of:
   logically combining the intermediate value and the shifted first value to produce a new first value.

9. The method according to claim 8, wherein said step of logically combining the intermediate value and the shifted first value comprises the step of:
   exclusive-ORing the intermediate value and the shifted first value.

10. An integrated circuit having an apparatus for performing scan testing, the apparatus comprising:
    first circuit means for logically combining a first binary value and a second binary value to produce an intermediate binary value;
    second circuit means, coupled to said first circuit means, said second circuit means exclusive-ORing the intermediate binary value and a third value;
    test control circuitry., coupled to said first circuit means and to said second circuit means, said test control circuitry controlling the scan testing;
    a first scan conductor, coupled to said first circuit means, said first scan conductor serially transferring a plurality of pseudo-random data bits; and
    a second scan conductor, coupled to said second circuit means, said second scan conductor serially transferring the third value.

11. The apparatus according to claim 10, wherein a first bit of the first value is a first bit of the plurality of pseudo-random data bits, and wherein the third value is a scan-out value.

12. The apparatus according to claim 10, wherein the apparatus further comprises:
    a circuit under test, coupled to said first scan conductor and to said second scan conductor.

13. The apparatus according to claim 10, wherein the apparatus further comprises:
    scan-input latches coupled to said first scan conductor; and scan-output latches, coupled to said second scan conductor.

14. The apparatus according to claim 10, wherein the apparatus further comprises:
a plurality of registers.

15. The apparatus according to claim 10, wherein the apparatus further comprises:
a counter, coupled to said first circuit means.

16. The apparatus according to claim 10, wherein the apparatus further comprises:
a bus, coupled to said second circuit means; and
a status bit, coupled to said bus, said status bit indicating if scan testing has been completed.

17. The apparatus according to claim 10, wherein the apparatus further comprises:
a carry inhibit signal; wherein said first circuit means comprises:
a logical ANDing circuit; and wherein said second circuit means comprises:
a first adder circuit having an output, said first adder circuit receiving the carry inhibit signal; and
a second adder circuit, having a first input coupled to said logical ANDing circuit, and having a second input coupled to the output of said first adder circuit, said second adder circuit receiving the carry inhibit signal.

18. A method for generating a plurality of pseudo-random bits in a data processor, the data processor having a plurality of registers and having a circuit for performing a logical combination function coupled to a circuit for performing an exclusive-OR function, the method comprising the steps of:
transferring, from a first one of the plurality of registers to a first bus, a first plurality of electrical signals which represent a first value;
transferring, from a second one of the plurality of registers to a second bus, a second plurality of electrical signals which represent a second value;
shifting the first value to produce a plurality of electrical signals which represent a shifted first value and a plurality of electrical signals which represent a feedback value;
logically combining the plurality of electrical signals which represent the feedback value and the plurality of electrical signals which represent the second value to produce a plurality of electrical signals which represent an intermediate value;
exclusive-ORing the plurality of electrical signals which represent the intermediate value and the plurality of electrical signals which represent the shifted first value to produce a first pseudo-random bit; and
generating a second pseudo-random bit.

19. The method according to claim 18, wherein all of said steps are performed during execution of an instruction.

20. A method for performing data compression in a data processor, the data processor having a plurality of registers and having a circuit for performing a logical combination function coupled to a circuit for performing an exclusive-OR function, the method comprising the steps of:
transferring, from a first one of the plurality of registers to a first bus, a first plurality of electrical signals which represent a first value;
transferring, from a second one of the plurality of registers to a second bus, a second plurality of electrical signals which represent a second value;
shifting the first value to produce a plurality of electrical signals which represent a shifted first value and a plurality of electrical signals which represent a feedback value;
logically combining the plurality of electrical signals which represent the feedback value and the plurality of electrical signals which represent the second value to produce a plurality of electrical signals which represent an intermediate value; and
exclusive-ORing the plurality of electrical signals which represent the intermediate value, the plurality of electrical signals which represent the shifted first value, and a plurality of electrical signals which represent a third value.

21. The method according to claim 20, wherein all of said steps are performed during execution of an instruction.

* * * * *